US 11,870,009 B2

(12) United States Patent
Check et al.

(10) Patent No.: US 11,870,009 B2
(45) Date of Patent: Jan. 9, 2024

(54) EDGE STRUCTURES FOR LIGHT SHAPING IN LIGHT-EMITTING DIODE CHIPS

(71) Applicant: CreeLED, Inc., Durham, NC (US)

(72) Inventors: Michael Check, Holly Springs, NC (US); Steven Wuester, Wake Forest, NC (US); Justin White, Morrisville, NC (US); Seth Joseph Balkey, Durham, NC (US)

(73) Assignee: CreeLED, Inc., Durham, NC (US)

( * ) Notice: Subject to any disclaimer, the term of this patent is extended or adjusted under 35 U.S.C. 154(b) by 62 days.

(21) Appl. No.: 17/396,160

(22) Filed: Aug. 6, 2021

(65) Prior Publication Data

US 2023/0037469 A1     Feb. 9, 2023

(51) Int. Cl.
| | |
|---|---|
| H01L 33/24 | (2010.01) |
| H01L 33/38 | (2010.01) |
| H01L 33/40 | (2010.01) |
| H01L 33/46 | (2010.01) |
| H01L 33/22 | (2010.01) |
| H01L 33/32 | (2010.01) |

(52) U.S. Cl.
CPC ............ *H01L 33/24* (2013.01); *H01L 33/382* (2013.01); *H01L 33/405* (2013.01); *H01L 33/46* (2013.01); *H01L 33/22* (2013.01); *H01L 33/32* (2013.01)

(58) Field of Classification Search
CPC ..... H01L 33/24; H01L 33/382; H01L 33/405; H01L 33/46
See application file for complete search history.

(56) References Cited

U.S. PATENT DOCUMENTS

| | | |
|---|---|---|
| 7,939,841 B2 | 5/2011 | Lee et al. |
| 8,410,679 B2 | 4/2013 | Ibbetson et al. |
| 8,425,271 B2 | 4/2013 | Hussell et al. |
| | (Continued) | |

FOREIGN PATENT DOCUMENTS

WO     2020137470 A1     7/2020

OTHER PUBLICATIONS

Author Unknown, "Dowsil JCR 6140 Optical Encapsulant," Technical Data Sheet, Form No. 11-3323-01 A, 2018, The Dow Chemical Company, 4 pages.

(Continued)

*Primary Examiner* — Mark W Tornow
(74) *Attorney, Agent, or Firm* — Withrow & Terranova, P.L.L.C.

(57) ABSTRACT

Light-emitting diodes (LEDs), and more particularly edge structures for light shaping in LED chips are disclosed. Edge structures may include a repeating pattern of features that is formed along one or more mesa sidewalls of active LED structure mesas. Such active LED structure mesas may include a p-type layer, an active layer, and at least a portion of an n-type layer. Features of the repeating pattern may be configured with a size and/or shape to promote redirection of laterally propagating light from the active layer at the mesa sidewalls. In this manner, light that may otherwise escape the LED chip at the mesa sidewalls may be redirected toward an intended emission direction for the LED chip. Certain aspects include reflective structures that are provided on the active LED structures mesas and are further arranged to extend past the active LED structure mesas to cover the repeating pattern of features.

22 Claims, 9 Drawing Sheets

(56) References Cited

U.S. PATENT DOCUMENTS

| | | | |
|---|---|---|---|
| 2003/0062529 A1* | 4/2003 | Kato | H01L 33/20 |
| | | | 257/79 |
| 2008/0237629 A1* | 10/2008 | Ando | H01L 33/025 |
| | | | 438/45 |
| 2013/0049015 A1* | 2/2013 | Fang | H01L 33/22 |
| | | | 438/42 |
| 2015/0034963 A1* | 2/2015 | Kinouchi | H01L 33/46 |
| | | | 257/76 |
| 2015/0060913 A1* | 3/2015 | Tsou | H01L 33/20 |
| | | | 257/98 |
| 2017/0098746 A1* | 4/2017 | Bergmann | H01L 33/22 |
| 2017/0294417 A1 | 10/2017 | Edmond et al. | |
| 2020/0203419 A1 | 6/2020 | Andrews et al. | |
| 2021/0408328 A1 | 12/2021 | Andrews | |
| 2022/0131048 A1 | 4/2022 | Andrews | |

OTHER PUBLICATIONS

International Search Report and Written Opinion for International Patent Application No. PCT/US2022/074572, dated Nov. 30, 2022, 12 pages.

Preliminary Examination Report for Taiwanese Patent Application No. 111129553, dated May 11, 2023, 25 pages.

\* cited by examiner

EDGE STRUCTURES FOR LIGHT SHAPING IN LIGHT-EMITTING DIODE CHIPS

FIELD OF THE DISCLOSURE

The present disclosure related to light-emitting diodes (LEDs), and more particularly to edge structures for light shaping in LED chips.

BACKGROUND

Solid-state lighting devices such as light-emitting diodes (LEDs) are increasingly used in both consumer and commercial applications. Advancements in LED technology have resulted in highly efficient and mechanically robust light sources with a long service life. Accordingly, modern LEDs have enabled a variety of new display applications and are being increasingly utilized for general illumination applications, often replacing incandescent and fluorescent light sources.

LEDs are solid-state devices that convert electrical energy to light and generally include one or more active layers of semiconductor material (or an active region) arranged between oppositely doped n-type and p-type layers. When a bias is applied across the doped layers, holes and electrons are injected into the one or more active layers where they recombine to generate emissions such as visible light or ultraviolet emissions. An active region may be fabricated, for example, from silicon carbide, gallium nitride, gallium phosphide, aluminum nitride, and/or gallium arsenide-based materials and/or from organic semiconductor materials. Photons generated by the active region are initiated in all directions.

Typically, it is desirable to operate LEDs at the highest light emission efficiency, which can be measured by the emission intensity in relation to the output power. A practical goal to enhance emission efficiency is to maximize extraction of light emitted by the active region in the direction of the desired transmission of light. Light extraction and external quantum efficiency of an LED can be limited by a number of factors, including internal reflection. According to the well-understood implications of Snell's law, photons reaching various internal interfaces within an LED and surfaces between the LED and a surrounding environment can be either refracted or internally reflected. If photons are internally reflected in a repeated manner, then such photons can eventually be absorbed and never provide visible light that exits an LED. To increase the opportunity for photons to exit an LED, it has been found useful to pattern, roughen, or otherwise texture certain LED surfaces to provide a varying surface that increases the probability of refraction over internal reflection and thus enhances light extraction out of these surfaces. LEDs have been developed with internal reflective surfaces or layers that reflect generated light for contribution to useful emission.

As advancements in modern LED technology progress, the art continues to seek improved LEDs and solid-state lighting devices having desirable illumination characteristics capable of overcoming challenges associated with conventional lighting devices.

SUMMARY

Aspects disclosed herein relate to light-emitting diodes (LEDs), and more particularly to edge structures for light shaping in LED chips. Edge structures may include a repeating pattern of features that is formed along one or more mesa sidewalls of active LED structure mesas. Such active LED structure mesas may include a p-type layer, an active layer, and at least a portion of an n-type layer. Features of the repeating pattern may be configured with a size and/or shape to promote redirection of laterally propagating light from the active layer at the mesa sidewalls. In this manner, light that may otherwise escape the LED chip at the mesa sidewalls may be redirected toward an intended emission direction for the LED chip. Certain aspects include reflective structures that are provided on the active LED structures mesas and are further arranged to extend past the active LED structure mesas to cover the repeating pattern of features.

In one aspect, an LED chip comprises: an n-type layer; a p-type layer; an active layer arranged between the n-type layer and the p-type layer, wherein the p-type layer, the active layer, and a portion of the n-type layer form an active LED structure mesa with at least one mesa sidewall, and wherein the at least one mesa sidewall forms a shape with a repeating pattern along the at least one mesa sidewall; and a reflective structure on the active LED structure mesa and on the at least one mesa sidewall, wherein the reflective structure is arranged to cover the repeating pattern. In certain embodiments, the reflective structure comprises a first reflective layer on the active LED structure mesa and on the at least one mesa sidewall. In certain embodiments, the reflective structure comprises a second reflective layer on the active LED structure mesa and on the at least one mesa sidewall, wherein the first reflective layer is arranged between the second reflective layer and the active LED structure mesa. The first reflective layer may comprise a dielectric layer and the second reflective layer comprises a metal layer. The LED chip may further comprise a p-contact electrically connected to the p-type layer and an n-contact electrically connected to the n-type layer, wherein a portion of the n-contact extends past the active LED structure mesa to electrically connect with portions of the n-type layer that are outside the active LED structure mesa. In certain embodiments, the at least one mesa sidewall is one of a plurality of mesa sidewalls of the active LED structure mesa and the n-contact electrically connects with portions of the n-type layer outside of three mesa sidewalls of the plurality of mesa sidewalls.

In certain embodiments, the repeating pattern is formed by a plurality of features in the mesa sidewall and each feature of the plurality of features abuts at least one neighboring feature of the plurality of features at an intersection. Each feature of the plurality of features may form an outwardly curved surface of the at least one mesa sidewall, or an inwardly curved surface of the at least one mesa sidewall, or a triangular cross-sectional shape along the at least one mesa sidewall, or a trapezoidal cross-sectional shape along the at least one mesa sidewall, or a rectangular cross-sectional shape along the at least one mesa sidewall.

In another aspect, an LED chip comprises: an n-type layer; a p-type layer; and an active layer arranged between the n-type layer and the p-type layer, wherein the p-type layer, the active layer, and a portion of the n-type layer form an active LED structure mesa with at least one mesa sidewall; wherein the at least one mesa sidewall forms a repeating pattern along the at least one mesa sidewall, the repeating pattern being formed by a plurality of features, and wherein each feature of the plurality of features abuts at least one next-adjacent feature of the plurality of features at an intersection. In certain embodiments, each intersection is formed by intersecting surfaces of next-adjacent features of the plurality of features. A width of each feature of the plurality of features may be provided in a range from 15 microns (μm) to 35 μm. In certain embodiments, the width of each feature of the plurality of features is in a range from 20 μm to 35. In certain embodiments, the repeating pattern extends along at least one mesa sidewall corner of the active LED structure mesa. In certain embodiments, at least one mesa sidewall corner of the active LED structure mesa is devoid of the repeating pattern. In certain embodiments, each feature of the plurality of features forms an outwardly curved surface of the at least one mesa sidewall. In certain embodiments, each feature of the plurality of features forms an inwardly curved surface of the at least one mesa sidewall.

In another aspect, an LED chip comprises: an n-type layer; a p-type layer; and an active layer arranged between the n-type layer and the p-type layer; wherein the p-type layer, the active layer, and a portion of the n-type layer form an active LED structure mesa with mesa sidewalls and mesa sidewall corners, wherein the mesa sidewalls form a repeating pattern along portions of the mesa sidewalls, and wherein the mesa sidewall corners are devoid of the repeating pattern. In certain embodiments, the repeating pattern is formed by a plurality of features in the mesa sidewalls and each feature of the plurality of features abuts at least one next-adjacent feature of the plurality of features at an intersection. In certain embodiments, the intersection is formed by intersecting surfaces of next-adjacent features of the plurality of features. In certain embodiments, a width of each feature of the plurality of features is in a range from 15 μm to 35 μm. In certain embodiments, a reflective structure is on the active LED structure mesa and on the mesa sidewalls, wherein the reflective structure is arranged to cover the repeating pattern.

In another aspect, any of the foregoing aspects individually or together, and/or various separate aspects and features as described herein, may be combined for additional advantage. Any of the various features and elements as disclosed herein may be combined with one or more other disclosed features and elements unless indicated to the contrary herein.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

DETAILED DESCRIPTION

Figure 1:
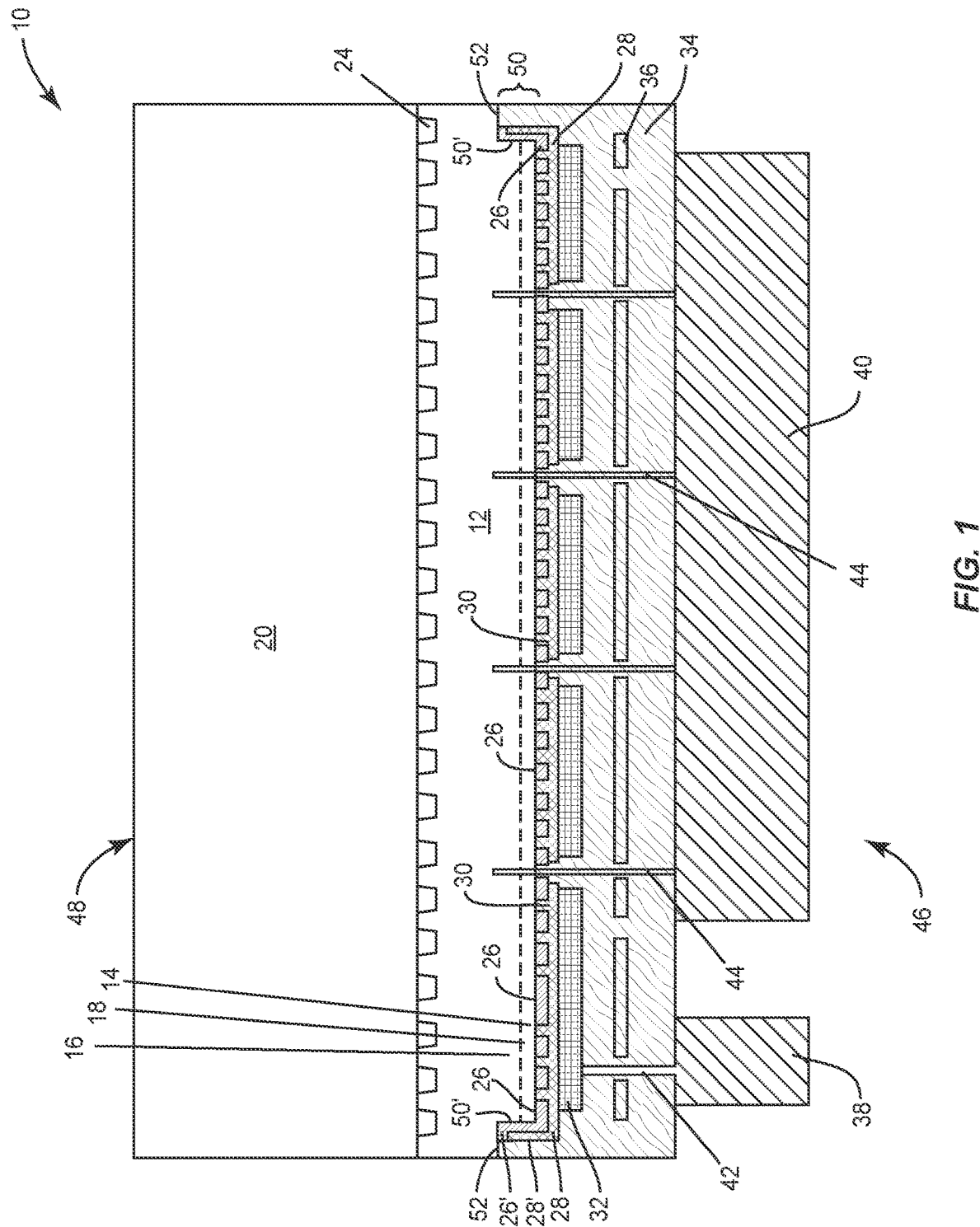
FIG. 1 is a cross-sectional view of a light-emitting diode (LED) chip arranged in a flip-chip configuration according to principles of the present disclosure.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Embodiments are described herein with reference to schematic illustrations of embodiments of the disclosure. As such, the actual dimensions of the layers and elements can be different, and variations from the shapes of the illustrations as a result, for example, of manufacturing techniques and/or tolerances, are expected. For example, a region illustrated or described as square or rectangular can have rounded or curved features, and regions shown as straight lines may have some irregularity. Thus, the regions illustrated in the figures are schematic and their shapes are not intended to illustrate the precise shape of a region of a device and are not intended to limit the scope of the disclosure. Additionally, sizes of structures or regions may be exaggerated relative to other structures or regions for illustrative purposes and, thus, are provided to illustrate the general structures of the present subject matter and may or may not be drawn to scale. Common elements between figures may be shown herein with common element numbers and may not be subsequently re-described.

Aspects disclosed herein relate to light-emitting diodes (LEDs), and more particularly to edge structures for light shaping in LED chips. Edge structures may include a repeating pattern of features that is formed along one or more mesa sidewalls of active LED structure mesas. Such active LED structure mesas may include a p-type layer, an active layer, and at least a portion of an n-type layer. Features of the repeating pattern may be configured with a size and/or shape to promote redirection of laterally propagating light from the active layer at the mesa sidewalls. In this manner, light that may otherwise escape the LED chip at the mesa sidewalls may be redirected toward an intended emission direction for the LED chip. Certain aspects include reflective structures that are provided on the active LED structures mesas and are further arranged to extend past the active LED structure mesas to cover the repeating pattern of features.

An LED chip typically comprises an active LED structure or region that may have many different semiconductor layers arranged in various structures. The fabrication and operation of LEDs and their active structures are generally known in the art and are only briefly discussed herein. The layers of the active LED structure may be fabricated using known processes with a suitable process being fabrication using metal organic chemical vapor deposition. The layers of the active LED structure may comprise many different layers and generally comprise an active layer sandwiched between n-type and p-type oppositely doped epitaxial layers, all of which are formed successively on a growth substrate. It is understood that additional layers and elements may also be included in the active LED structure, including, but not limited to, buffer layers, nucleation layers, super lattice structures, un-doped layers, cladding layers, contact layers, and current-spreading layers and light extraction layers and elements. The active layer may comprise a single quantum well, a multiple quantum well, a double heterostructure, or super lattice structures.

The active LED structure may be fabricated from different material systems, with some material systems being Group III nitride-based material systems. Group III nitrides refer to those semiconductor compounds formed between nitrogen (N) and the elements in Group III of the periodic table, usually aluminum (Al), gallium (Ga), and indium (In). Gallium nitride (GaN) is a common binary compound. Group III nitrides also refer to ternary and quaternary compounds such as aluminum gallium nitride (AlGaN), indium gallium nitride (InGaN), and aluminum indium gallium nitride (AlInGaN). For Group III nitrides, silicon (Si) is a common n-type dopant and magnesium (Mg) is a common p-type dopant. Accordingly, the active layer, n-type layer, and p-type layer may include one or more layers of GaN, AlGaN, InGaN, and AlInGaN that are either undoped or doped with Si or Mg for a material system based on Group III nitrides. Other material systems include silicon carbide (SiC), organic semiconductor materials, and other Group III-V systems such as gallium phosphide (GaP), gallium arsenide (GaAs), and related compounds.

The active LED structure may be grown on a growth substrate that may include many materials, such as sapphire, SiC, aluminum nitride (AlN), GaN, with a suitable substrate being a 4H polytype of SiC, although other SiC polytypes may also be used including 3C, 6H, and 15R polytypes. SiC has certain advantages, such as a closer crystal lattice match to Group III nitrides than other substrates and results in Group III nitride films of high quality. SiC also has a very high thermal conductivity so that the total output power of Group III nitride devices on SiC is not limited by the thermal dissipation of the substrate. Sapphire is another common substrate for Group III nitrides and also has certain advantages, including being lower cost, having established manufacturing processes, and having good light transmissive optical properties.

Different embodiments of the active LED structure may emit different wavelengths of light depending on the composition of the active layer and n-type and p-type layers. In certain embodiments, the active LED structure is configured to emit blue light with a peak wavelength range of approximately 430 nanometers (nm) to 480 nm. In other embodiments, the active LED structure is configured to emit green light with a peak wavelength range of 500 nm to 570 nm. In other embodiments, the active LED structure is configured to emit red light with a peak wavelength range of 600 nm to 650 nm.

The LED chip may also be covered with one or more lumiphoric or other conversion materials, such as phosphors, such that at least some of the light from the LED chip is absorbed by the one or more phosphors and is converted to one or more different wavelength spectra according to the characteristic emission from the one or more phosphors. In certain embodiments, the combination of the LED chip and the one or more phosphors emits a generally white combination of light. The one or more phosphors may include yellow (e.g., YAG:Ce), green (e.g., LuAg:Ce), and red (e.g., $Ca_{i-x-y}Sr_xEu_yAlSiN_3$) emitting phosphors, and combinations thereof. Lumiphoric materials as described herein may be or include one or more of a phosphor, a scintillator, a lumiphoric ink, a quantum dot material, a day glow tape, and the like. Lumiphoric materials may be provided by any suitable means, for example, direct coating on one or more surfaces of an LED, dispersal in an encapsulant material configured to cover one or more LEDs, and/or coating on one or more optical or support elements (e.g., by powder coating, inkjet printing, or the like). In certain embodiments, lumiphoric materials may be downconverting or upconverting, and combinations of both downconverting and upconverting materials may be provided. In certain embodiments, multiple different (e.g., compositionally different) lumiphoric materials arranged to produce different peak wavelengths may be arranged to receive emissions from one or more LED chips. In certain embodiments, one or more phosphors may include yellow phosphor (e.g., YAG:Ce), green phosphor (e.g., LuAg:Ce), and red phosphor (e.g., $Ca_{i-x-y}Sr_xEu_y-AlSiN_3$) and combinations thereof. One or more lumiphoric materials may be provided on one or more portions of an LED chip and/or a submount in various configurations. In certain embodiments, one or more surfaces of LED chips may be conformally coated with one or more lumiphoric materials, while other surfaces of such LED chips and/or associated submounts may be devoid of lumiphoric material. In certain embodiments, a top surface of an LED chip may include lumiphoric material, while one or more side surfaces of an LED chip may be devoid of lumiphoric material. In certain embodiments, all or substantially all outer surfaces of an LED chip (e.g., other than contact-defining or mounting surfaces) are coated or otherwise covered with one or more lumiphoric materials. In certain embodiments, one or more lumiphoric materials may be arranged on or over one or more surfaces of an LED chip in a substantially uniform manner. In other embodiments, one or more lumiphoric materials may be arranged on or over one or more surfaces of an LED chip in a manner that is non-uniform with respect to one or more of material composition, concentration, and thickness. In certain embodiments, the loading percentage of one or more lumiphoric materials may be varied on or among one or more outer surfaces of an LED chip. In certain embodiments, one or more lumiphoric materials may be patterned on portions of one or more surfaces of an LED chip to include one or more stripes, dots, curves, or polygonal shapes. In certain embodiments, multiple lumiphoric materials may be arranged in different discrete regions or discrete layers on or over an LED chip.

Light emitted by the active layer or region of an LED chip typically has a lambertian emission pattern. For directional applications, internal mirrors or external reflective surfaces may be employed to redirect as much light as possible toward a desired emission direction. Internal mirrors may include single or multiple layers. Some multi-layer mirrors include a metal reflector layer and a dielectric reflector layer, wherein the dielectric reflector layer is arranged between the metal reflector layer and a plurality of semiconductor layers. A passivation layer is arranged between the metal reflector layer and first and second electrical contacts, wherein the first electrical contact is arranged in conductive electrical communication with a first semiconductor layer, and the second electrical contact is arranged in conductive electrical communication with a second semiconductor layer. For single or multi-layer mirrors including surfaces exhibiting less than 100% reflectivity, some light may be absorbed by the mirror. Additionally, light that is redirected through the active LED structure may be absorbed by other layers or elements within the LED chip.

As used herein, a layer or region of a light-emitting device may be considered to be "transparent" when at least 80% of emitted radiation that impinges on the layer or region emerges through the layer or region. Moreover, as used herein, a layer or region of an LED is considered to be "reflective" or embody a "mirror" or a "reflector" when at least 80% of the emitted radiation that impinges on the layer or region is reflected. In certain embodiments, the emitted radiation comprises visible light such as blue and/or green LEDs with or without lumiphoric materials. In other embodiments, the emitted radiation may comprise nonvisible light. For example, in the context of GaN-based blue and/or green LEDs, silver (Ag) may be considered a reflective material (e.g., at least 80% reflective). In the case of ultraviolet (UV) LEDs, appropriate materials may be selected to provide a desired, and in certain embodiments high, reflectivity and/or a desired, and in certain embodiments low, absorption. In certain embodiments, a "light-transmissive" material may be configured to transmit at least 50% of emitted radiation of a desired wavelength.

The present disclosure may be useful for LED chips having a variety of geometries, such as vertical geometry or lateral geometry. A vertical geometry LED chip typically includes anode and cathode connections on opposing sides or faces of the LED chip. A lateral geometry LED chip typically includes both anode and cathode connections on the same side of the LED chip that is opposite a substrate, such as a growth substrate. In certain embodiments, a lateral geometry LED chip may be mounted on a submount of an LED package such that the anode and cathode connections are on a face of the LED chip that is opposite the submount. In this configuration, wirebonds may be used to provide electrical connections with the anode and cathode connections. In other embodiments, a lateral geometry LED chip may be flip-chip mounted on a surface of a submount of an LED package such that the anode and cathode connections are on a face of the active LED structure that is adjacent to the submount. In this configuration, electrical traces or patterns may be provided on the submount for providing electrical connections to the anode and cathode connections of the LED chip. In a flip-chip configuration, the active LED structure is configured between the substrate of the LED chip and the submount for the LED package. Accordingly, light emitted from the active LED structure may pass through the substrate in a desired emission direction.

FIG. 1 is a cross-sectional view of an LED chip 10 arranged in a flip-chip configuration according to principles of the present disclosure. While a flip-chip configuration is shown, other LED chip structures are also possible without deviating from the principles disclosed. The LED chip 10 includes an active structure 12 comprising a p-type layer 14, an n-type layer 16, and an active layer 18 formed on a substrate 20. In certain embodiments, the n-type layer 16 is arranged between the active layer 18 and the substrate 20. In other embodiments, the doping order may be reversed such that layer 16 is doped p-type and layer 14 is doped n-type. The substrate 20 may comprise many different materials such as SiC or sapphire and may have one or more surfaces that are shaped, textured, or patterned to enhance light extraction. In certain embodiments, the substrate 20 is light transmissive (preferably transparent) and may include a patterned surface 24 that is proximate the active LED structure 12 and includes multiple recessed and/or raised features. In certain embodiments, the patterned surface 24 is adjacent the n-type layer 16 of the active LED structure 12. The patterned surface 24 is particularly useful in embodiments in which the substrate 20 comprises sapphire in order to promote extraction of light through an interface between the active LED structure 12 and the substrate 20.

In FIG. 1, a first reflective layer 26 is provided on the p-type layer 14. In certain embodiments, a current spreading layer (as further illustrated in FIG. 2) may be provided between the p-type layer 14 and the first reflective layer 26. The current spreading layer may include a thin layer of a transparent conductive oxide such indium tin oxide (ITO) or a metal such as platinum (Pt), although other materials may be used. The first reflective layer 26 may comprise many different materials and preferably comprises a material that presents an index of refraction step with the material comprising the active LED structure 12 to promote total internal reflection (TIR) of light generated from the active LED structure 12. Light that experiences TIR is redirected without experiencing absorption or loss and may thereby contribute to useful or desired LED chip emission. In certain embodiments, the first reflective layer 26 comprises a material with an index of refraction lower than the index of refraction of the active LED structure 12 material. The first reflective layer 26 may comprise many different materials, with some having an index of refraction less than 2.3, while others may have an index of refraction less than 2.15, less than 2.0, and less than 1.5. In certain embodiments the first reflective layer 26 comprises a dielectric material, with certain embodiments comprising silicon dioxide ($SiO_2$) and/or silicon nitride (SiN). It is understood that many dielectric materials may be used such as SiN, SiNx, $Si_3N_4$, Si, germanium (Ge), $SiO_2$, SiOx, titanium dioxide ($TiO_2$), tantalum pentoxide ($Ta_2O_5$), ITO, magnesium oxide (MgOx), zinc oxide (ZnO), and combinations thereof. In certain embodiments, the first reflective layer 26 may include multiple alternating layers of different dielectric materials, e.g., alternating layers of $SiO_2$ and SiN that symmetrically repeat or are asymmetrically arranged. Some Group III nitride materials such as GaN may have an index of refraction of approximately 2.4, and $SiO_2$ may have an index of refraction of approximately 1.48, and SiN may have an index of refraction of approximately 1.9. Embodiments with an active LED structure 12 comprising GaN and the first reflective layer 26 that comprises $SiO_2$ may have a sufficient index of refraction step between the two to allow for efficient TIR of light. The first reflective layer 26 may have different thicknesses depending on the type of materials used, with certain embodiments having a thickness of at least 0.2 microns (μm). In some of these embodiments, the first reflective layer 26 may have a thickness in the range of 0.2 μm to 0.7 μm, while in some of these embodiments it may be approximately 0.5 μm thick.

In FIG. 1, the LED chip 10 may further include a second reflective layer 28 that is on the first reflective layer 26 such that the first reflective layer 26 is arranged between the active LED structure 12 and the second reflective layer 28. The second reflective layer 28 may include a metal layer that is configured to reflect any light from the active LED structure 12 that may pass through the first reflective layer 26. The second reflective layer 28 may comprise many different materials such as Ag, gold (Au), Al, or combinations thereof. As illustrated, the second reflective layer 28 may include one or more reflective layer interconnects 30 that provide an electrically conductive path through the first reflective layer 26. In certain embodiments, the reflective layer interconnects 30 comprise reflective layer vias. Accordingly, the first reflective layer 26, the second reflective layer 28, and the reflective layer interconnects 30 form a reflective structure of the LED chip 10. In certain embodiments, the reflective layer interconnects 30 comprise the same material as the second reflective layer 28 and are formed at the same time as the second reflective layer 28. In other embodiments, the reflective layer interconnects 30 may comprise a different material than the second reflective layer 28. The LED chip 10 may also comprise a barrier layer 32 on the second reflective layer 28 to prevent migration of the second reflective layer 28 material, such as Ag, to other layers. Preventing this migration helps the LED chip 10 maintain efficient operation through its lifetime. The barrier layer 32 may comprise an electrically conductive material, with suitable materials including but not limited to sputtered Ti/Pt followed by evaporated Au bulk material or sputtered Ti/Ni followed by an evaporated Ti/Au bulk material. A passivation layer 34 is included on the barrier layer 32 as well as any portions of the second reflective layer 28 that may be uncovered by the barrier layer 32. The passivation layer 34 protects and provides electrical insulation for the LED chip 10 and may comprise many different materials, such as a dielectric material. In certain embodiments, the passivation layer 34 is a single layer, and in other embodiments, the passivation layer 34 comprises a plurality of layers. A suitable material for the passivation layer 34 includes but is not limited to silicon nitride. In certain embodiments, the passivation layer 34 includes a metal-containing interlayer 36 arranged therein, wherein the interlayer 36 may comprise Al or another suitable metal. Notably, the interlayer 36 is embedded within the passivation layer 34 and is electrically isolated from the rest of the LED chip 10. In application, the interlayer 36 may function as a crack stop layer for any cracks that may propagate through the passivation layer 34. Additionally, the interlayer 36 may reflect at least some light that may pass through both the first reflective layer 26 and the second reflective layer 28.

In FIG. 1, the LED chip 10 comprises a p-contact 38 and an n-contact 40 that are arranged on the passivation layer 34 and are configured to provide electrical connections with the active LED structure 12. The p-contact 38, which may also be referred to as an anode contact, may comprise one or more p-contact interconnects 42 that extend through the passivation layer 34 to the barrier layer 32 or the second reflective layer 28 to provide an electrical path to the p-type layer 14. In certain embodiments, the one or more p-contact interconnects 42 comprise one or more p-contact vias. The n-contact 40, which may also be referred to as a cathode contact, may comprise one or more n-contact interconnects 44 that extend through the passivation layer 34, the barrier layer 32, the first and second reflective layers 26, 28, the p-type layer 14, and the active layer 18 to provide an electrical path to the n-type layer 16. In certain embodiments, the one or more n-contact interconnects 44 comprise one or more n-contact vias. In operation, a signal applied across the p-contact 38 and the n-contact 40 is conducted to the p-type layer 14 and the n-type layer 16, causing the LED chip 10 to emit light from the active layer 18. The p-contact 38 and the n-contact 40 may comprise many different materials such as Au, copper (Cu), nickel (Ni), In, Al, Ag, tin (Sn), Pt, or combinations thereof. In still other embodiments, the p-contact 38 and the n-contact 40 may comprise conducting oxides and transparent conducting oxides such as ITO, nickel oxide (NiO), ZnO, cadmium tin oxide, indium oxide, tin oxide, magnesium oxide, $ZnGa_2O_4$, $ZnO_2$/Sb, $Ga_2O_3$/Sn, $AgInO_2$/Sn, $In_2O_3$/Zn, $CuAlO_2$, LaCuOS, $CuGaO_2$, and $SrCu_2O_2$. The choice of material used may depend on the location of the contacts and on the desired electrical characteristics, such as transparency, junction resistivity, and sheet resistance. As described above, the LED chip 10 is arranged for flip-chip mounting and the p-contact 38 and n-contact 40 are configured to be mounted or bonded to a surface, such as a printed circuit board. In this regard, the LED chip 10 includes a mounting face 46 that is configured to be mounted to a surface, and a primary light-emitting face 48 that is opposite the mounting face 46. In certain embodiments, the primary light-emitting face 48 comprises the substrate 20, and light emitted from the active layer 18 primarily exits the LED chip 10 through the substrate 20. In other embodiments, the substrate 20 may be removed or replaced.

As illustrated, a portion of the active LED structure 12 extends away from the substrate 20 and forms a mesa 50 with a mesa sidewall 50'. The mesa 50 may include the p-type layer 14, the active layer 18, and a portion of the n-type layer 16. The active LED structure 12 may further include at least one recess 52 that is arranged around a periphery of the LED chip 10 such that the mesa 50 is laterally bounded by at least one recess 52. As illustrated, the at least one recess 52 may be formed by a lateral portion of the n-type layer 16 that is outside the boundary of the mesa 50. When the LED chip 10 is electrically activated, light is generated in the active layer 18 that is within the mesa 50. In this regard, the mesa sidewall 50' forms an edge of the light-emitting portion of the LED chip 10.

As will be later described in greater detail, embodiments of the present disclosure provide light-shaping features of the mesa sidewall 50' alone or in combination with additional light-shaping features that are on the mesa sidewall 50' to shape light output from the LED chip 10. Such light-shaping features may be provided to steer laterally propagating light from the active layer 18 toward the primary light-emitting face 48. Features of the mesa sidewall 50' may include various nonplanar portions of the mesa sidewall 50' that are specifically shaped to redirect light toward the primary light-emitting face 48, thereby reducing light that may otherwise escape the mesa sidewall 50'.

Additional light-shaping features that are on the mesa sidewall 50' may include one or more reflective layers that cover the light shaping features of the mesa sidewall 50'. By way of example, the first reflective layer 26 and/or the second reflective layer 28 of FIG. 1 may form such additional light-shaping features. As illustrated, the first reflective layer 26 and the second reflective layer 28 may include portions that are proximate to the active LED structure 12 and wraparound peripheral portions of the mesa 50. In certain embodiments, the at least one recess 52 includes a peripheral wraparound portion 26' of the first reflective layer 26 that bounds peripheral portions of the active LED structure 12 forming the mesa 50. Additionally, the at least one recess 52 includes a peripheral wraparound portion 28' of the second reflective layer 28 that is arranged in contact with a portion of a wraparound portion 26' of the first reflective layer 26. Within the at least one recess 52, the wraparound portion 26' and peripheral wraparound portion 28' are peripherally bounded by passivation material of the passivation layer 34. In certain embodiments, only the first reflective layer 26 may include the wraparound portion 26' while the second reflective layer 28 does not extend into the recess 52.

Figure 2:
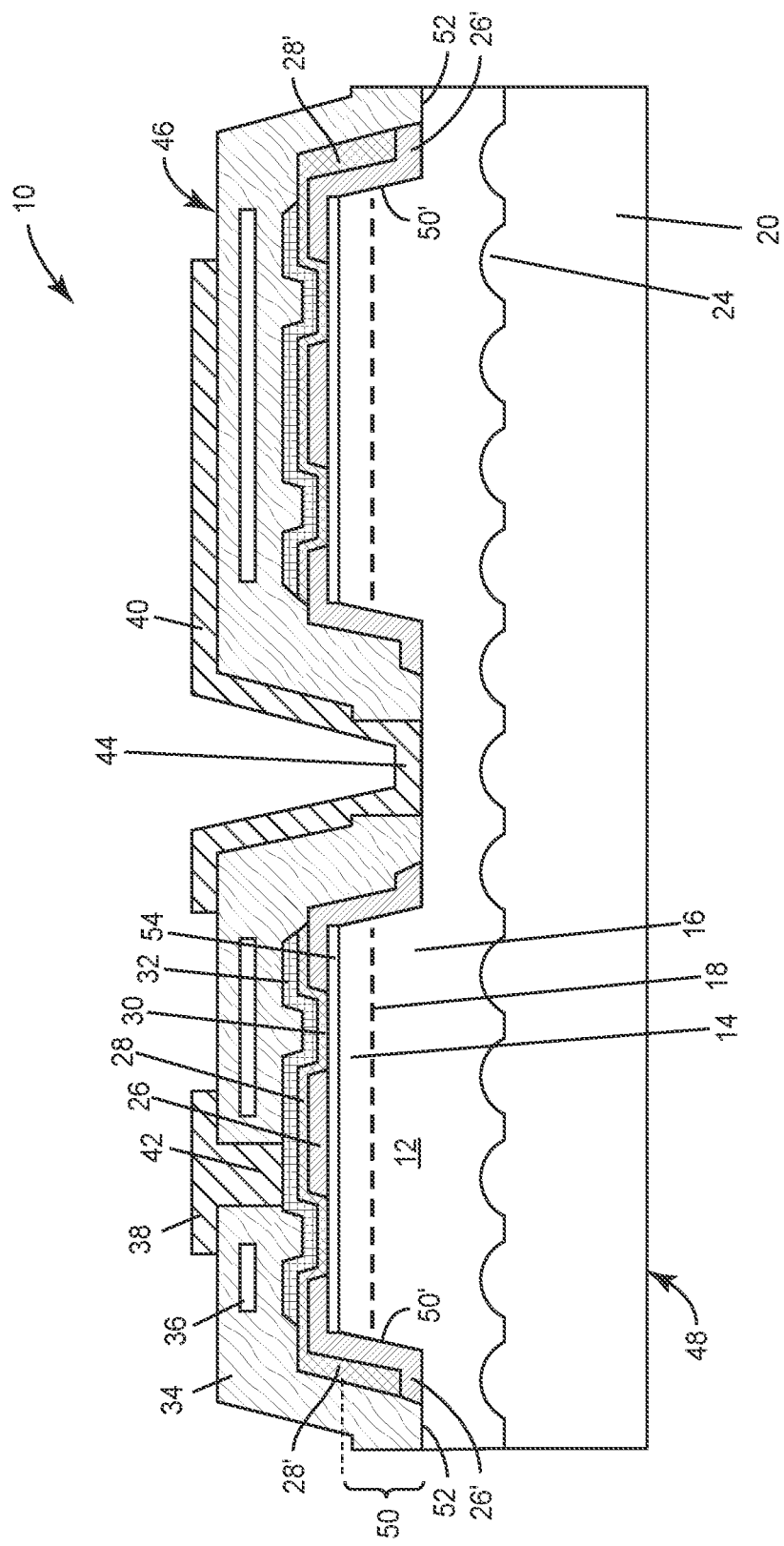
FIG. 2 is cross-sectional view of a portion of the LED chip of FIG. 1 before flip-chip mounting.

FIG. 2 is cross-sectional view of a portion of the LED chip 10 of FIG. 1 before flip-chip mounting and includes the active LED structure 12, the p-type layer 14, the n-type layer 16, the active layer 18, the substrate 20, the patterned surface 24, the first reflective layer 26, the second reflective layer 28, the one or more reflective layer interconnects 30, the barrier layer 32, the passivation layer 34, and the interlayer 36 as previously described. A current spreading layer 54 as previously described is visible in FIG. 2. As shown, the p-contact 38, the p-contact interconnect 42, the n-contact 40, and the n-contact interconnect 44 extend through the passivation layer 34. Notably, the n-contact interconnect 44 extends through a larger opening in the passivation layer 34 than an opening in the passivation layer 34 through which the p-contact interconnect 42 extends. The n-contact interconnect 44 additionally extends through an opening in the active LED structure 12 including the p-type layer 14, the active layer 18, and a portion of the n-type layer 16. In this regard, the n-contact interconnect 44 is relatively larger than the p-contact interconnect 42 and the reflective layer interconnects 30. In certain embodiments, a portion of the first reflective layer 26 may be arranged along a sidewall of the opening in the active LED structure 12 where the n-contact interconnect 44 is formed. In this regard, at least some light generated from the active LED structure 12 that travels in a direction toward the n-contact interconnect 44 may be redirected without being lost to absorption in the n-contact interconnect 44. As illustrated, the peripheral wraparound portion 26' of the first reflective layer 26 and/or the peripheral wraparound portion 28' of the second reflective layer 28 extend outside the mesa 50 and along the mesa sidewall 50' as described above for FIG. 1.

Figure 3A:
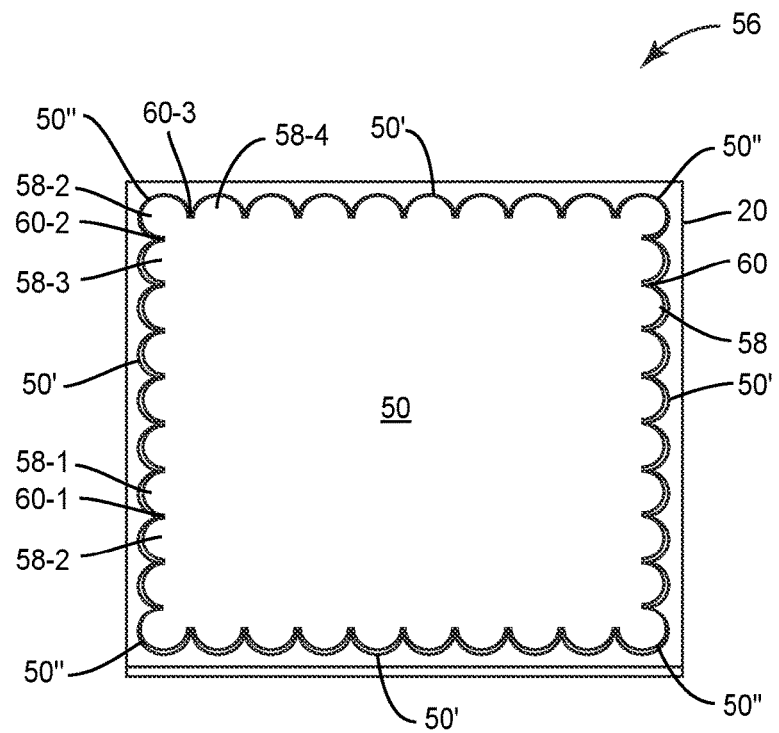
FIG. 3A is a simplified bottom view of an LED chip that is similar to the LED chip of FIGS. 1 and 2 where the mesa sidewall includes features that are configured to shape light.

FIG. 3A is a simplified bottom view of an LED chip 56 that is similar to the LED chip 10 of FIGS. 1 and 2 where the mesa sidewall 50' includes features 58 that are configured to shape light. For illustrative purposes, only the substrate 20 and mesa 50 from FIG. 1 are shown, although in practice, the LED chip 56 may include any of the above-described elements for the LED chip 10 of FIGS. 1 and 2. The bottom view provided in FIG. 3A corresponds with the mounting face 46 as illustrated in FIG. 1 from a slightly tilted perspective view. As illustrated, the mesa 50 that is formed from portions of the active LED structure 12 of FIG. 1 is formed with a smaller area than an overall area of the supporting substrate 20. In this regard, the mesa sidewalls 50' are inset from peripheral edges of the substrate 20. In certain embodiments, the mesa sidewalls 50' are formed with a plurality of features 58 that form a repeating pattern or structure along the mesa sidewalls 50'. The repeating pattern may be formed concurrently with the mesa 50 by etching the active layer structure 12 of FIG. 1 through a patterned mask. In certain embodiments, the features are laterally arranged, one after another, in a direction that corresponds with each of the mesa sidewalls 50'.

In certain embodiments, each individual feature 58 abuts at least one neighboring feature 58 at an intersection 60 therebetween. Each intersection 60 may be formed by intersecting surfaces of next-adjacent features 58. For example, next-adjacent features 58-1, 58-2 form an intersection 60-1 along one of the mesa sidewalls 50'. In certain embodiments, the intersection 60-1, which may be representative of all of the intersections 60 along each of the mesa sidewalls 50', may form a sharp intersection between two surfaces of the next-adjacent features 58-1, 58-2. In further embodiments, the next-adjacent features 58-1, 58-2 may be slightly spaced from one another such that the intersection 60-1 is formed by a portion of the mesa sidewall 50' that is between the neighboring features 58-1, 58-2. With either the sharp intersection or the slightly spaced arrangement, the intersections 60 may advantageously redirect laterally propagating light away from the mesa sidewalls 50' and toward intended emission directions for the LED chip 56.

As further illustrated in FIG. 3A, mesa sidewall corners 50" may be formed where mesa sidewalls 50' connect. In certain embodiments, the features 58 are formed with repeating dimensions specifically designed to repeat along one or more of the mesa sidewalls 50' and the mesa sidewall corners 50". For example, a feature 58-2 is formed at one of the mesa sidewall corners 50". The feature 58-2 includes a neighboring feature 58-3 with an intersection 60-2 formed therebetween and another neighboring feature 58-4 with an intersection 60-3 formed therebetween. As illustrated, each of the features 58-3 and 58-4 may form half-circle shapes with a same diameter from the bottom view provided in FIG. 3A and the feature 58-2 forms a three-quarter circle shape with a same diameter as the half-circle shapes.

Figure 3B:
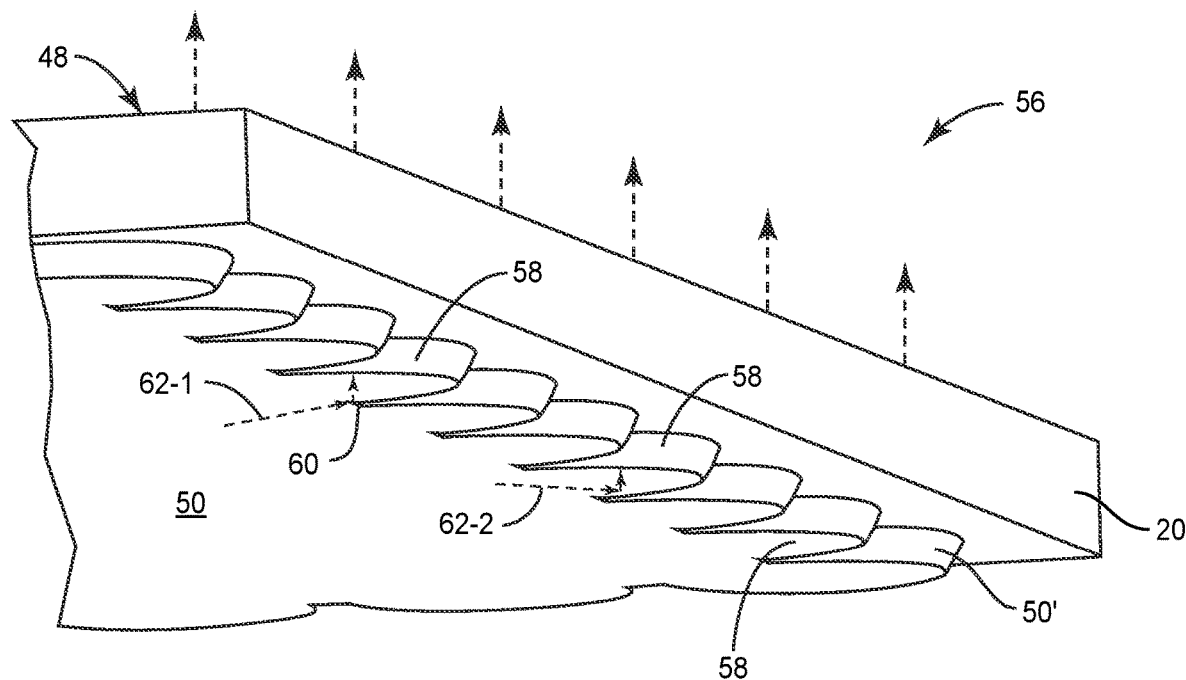
FIG. 3B is a perspective view of a portion of the LED chip of FIG. 3A shown with an orientation for flip-chip mounting.

FIG. 3B is a perspective view of a portion of the LED chip 56 of FIG. 3A shown with an orientation for flip-chip mounting. As illustrated, the primary light-emitting face 48 of the LED chip 56 is provided by a surface of the substrate 20 that is opposite the mesa 50. In this regard, light generated within the mesa 50 may travel through the substrate 20 toward the intended emission direction of the LED chip 56. Superimposed dashed-line arrows are provided in FIG. 3B to illustrate various light propagation paths that demonstrate the light shaping and/or redirecting interactions with the mesa sidewalls 50'. For example, a first light path 62-1 may propagate laterally through the mesa 50 before being redirected toward the primary light-emitting face 48 by the intersection 60. In another example, a second light path 62-2 may propagate laterally through the mesa 50 before being redirected by a surface of mesa sidewall 50' formed by one of the features 58. As illustrated, the repeating pattern of features 58 may form columns that are aligned one after another along the mesa sidewall 50'. In certain embodiments, the portions of the mesa sidewall 50' that form the features 58 may be angled with respect to the substrate 20 such that portions of each feature 58 closest to the substrate 20 are wider than portions of each feature 58 that are farther away from the substrate 20. As described herein, the shape of the repeating pattern of features 58 along the mesa sidewall 50', alone or in combination with the reflective structure formed by one or more of the first reflective layer 26 and the second reflective layer 28 of FIG. 1, may reduce light that would otherwise escape through the mesa sidewalls 50'.

Figure 4:
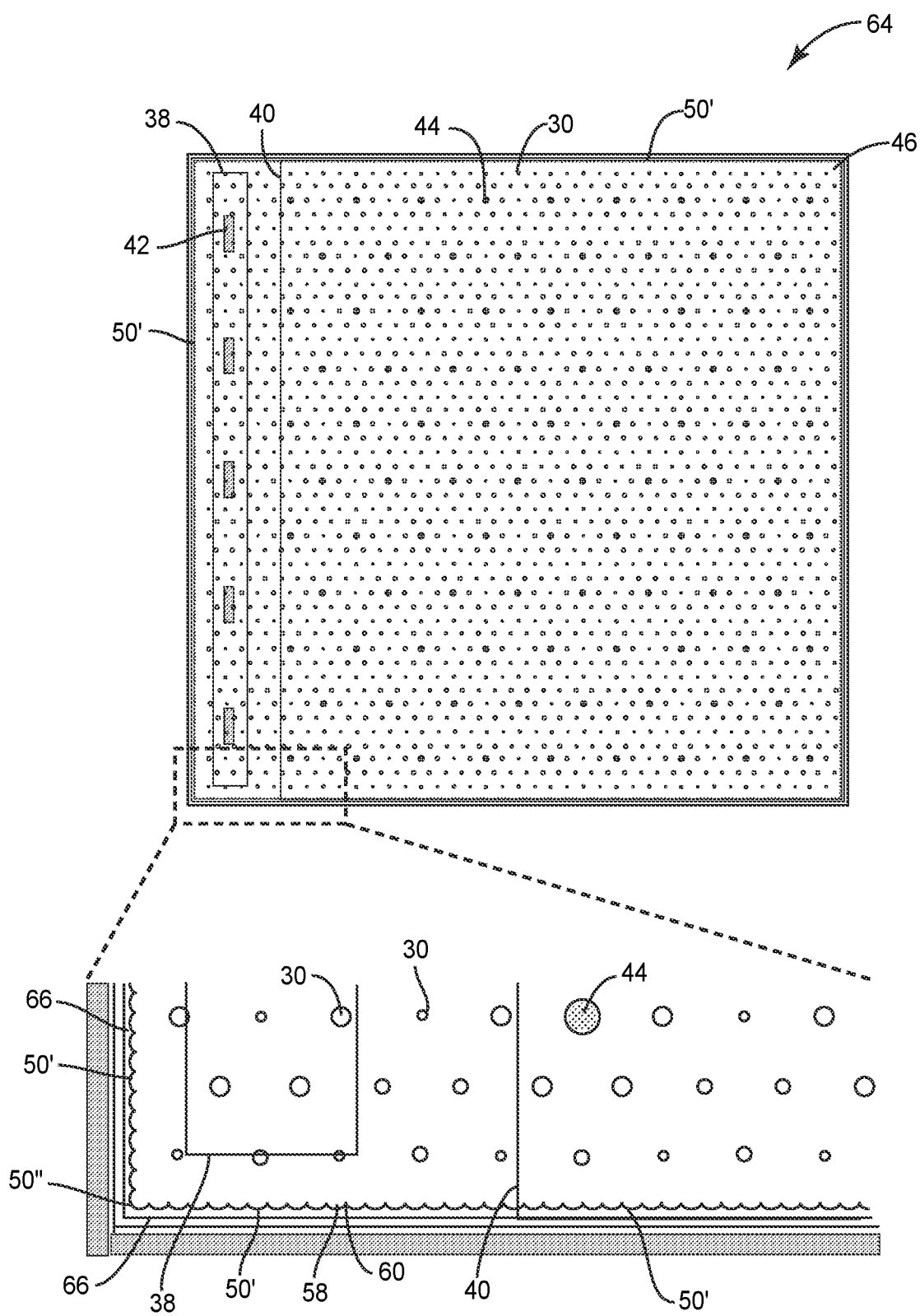
FIG. 4 is a bottom view of an exemplary LED chip that includes a repeating pattern of features along mesa sidewalls and a reflective structure that covers the features according to principles of the present disclosure.

FIG. 4 is a bottom view of an exemplary LED chip 64 that includes a repeating pattern of features 58 along mesa sidewalls 50' and a reflective structure 66 that covers the features 58 according to principles of the present disclosure. An exploded and zoomed view of a corner portion of the LED chip 64 is also provided in FIG. 4 to better illustrate certain aspects of the LED chip 64. The LED chip 64 is similar to the LED chip 10 of FIGS. 1 and 2. In this regard, the view provided in FIG. 4 is from the mounting face 46 of the LED chip 64. As illustrated, the n-contact interconnects 44 and the reflective layer interconnects 30 are spread across the LED chip 64. In certain embodiments, the n-contact interconnects 44 are located underneath the n-contact 40 while the reflective layer interconnects 30 are located underneath both the p-contact 38 and the n-contact 40. As illustrated, the p-contact 38 is formed in the shape of a narrow rectangle that is inset from and extends along at least one of the mesa sidewalls 50'. Depending on its relative size, the p-contact 38 may include several of the p-contact interconnects 42. In certain embodiments, the n-contact 40 is formed in the shape of a wider rectangle that covers a larger portion of the mounting face 46 than the p-contact 38. As previously described, the mounting face 46 of the LED chip 64 is configured to be mounted to another surface, including a reflective surface, a heat sink, another substrate, a printed circuit board, and a housing of a lighting device, among others.

As best illustrated in the exploded and zoomed view in FIG. 4, the mesa sidewalls 50' may include the features 58 and intersections 60 as previously described. Additionally, the reflective structure 66 is arranged to cover the mesa sidewalls 50' and the mesa sidewall corners 50", including the features 58 and corresponding intersections 60. In certain embodiments, the reflective structure 66 includes one or more of the first reflective layer 26 and the second reflective layer 28 as described above for FIGS. 1 and 2. For example, the reflective structure 66 may comprise the peripheral wraparound portion 26' of the first reflective layer 26 and/or the peripheral wraparound portion 28' of the second reflective layer 28 that cover the mesa sidewalls 50' as illustrated in FIGS. 1 and 2. In this regard, the reflective structure 66 may cover portions of the mesa 50 and the mesa sidewalls 50'. The reflective structure 66, in combination with the features 58 and intersections 60 of the mesa sidewalls 50', may serve to redirect laterally propagating light from exiting the mesa sidewalls 50', thereby increasing amounts of light that may exit the LED chip 64 in a desired direction that is also away from the mounting face 46.

Since light exiting the mesa sidewalls 50' is reduced, additional structures may be arranged along portions (e.g., streets) of the LED chip 64 that are outside the mesa sidewalls 50' with reduced light loss attributed to light absorption in such structures. For example, portions of the n-contact 40 may be arranged to laterally extend past one or more of the mesa sidewalls 50' to electrically connect with portions of the n-type layer (16 of FIGS. 1 and 2) that are outside the mesa sidewalls 50'. In this regard, additional electrical connections are provided along the perimeter of the LED chip 64 to provide increased current spreading. By way of example, in FIG. 4, the n-contact 40 is arranged to extend past three different mesa sidewalls 50' of the LED chip 64. Additionally, the n-contact 40 may be arranged to extend past at least two of the mesa sidewall corners 50" that connect the three different mesa sidewalls 50'. In any of the above-described arrangements where the n-contact 40 extends past one or more of the mesa sidewalls 50', a number of the n-contact interconnects 44 may also be reduced, thereby providing more light-emitting area within the active LED structure mesa and a brighter overall light output for the LED chip 64.

Figure 5:
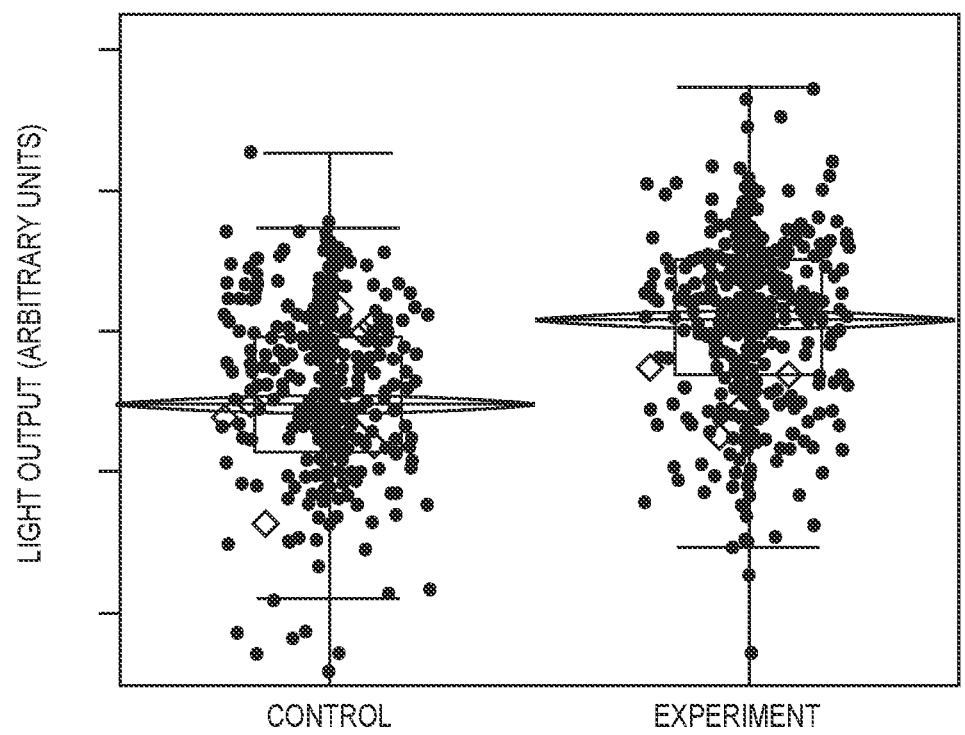
FIG. 5 is a plot comparing light output for LED chips with and without the repeating pattern of features as illustrated in FIG. 4.

FIG. 5 is a plot comparing light output for LED chips with and without the repeating pattern of features 58 as illustrated in FIG. 4. The data in FIG. 5 was collected for an experiment population of LED chips that included the repeating pattern of features 58 as illustrated in FIG. 4 and a control population of LED chips that were configured the same as the experiment population but without any repeating pattern of features. As illustrated, the experiment population demonstrated a statistically significant increase in light output due to light being redirected away from the mesa sidewalls and toward intended emission directions. Additionally, the experiment was repeated for LED chips that included the repeating pattern of features 58 and the reflective structure 66 as illustrated in FIG. 4 and in such configurations, the LED chips either maintained the increased light output or exhibited higher light outputs.

According to principles of the present disclosure, the repeating pattern of features along mesa sidewalls may include any number of patterns that are configured to redirect light in desired emission directions while reducing amounts of light that exit mesa sidewalls. Patterns may be continuous along all mesa sidewalls and corresponding corners or the patterns may be discontinuous along one or more portions of mesa sidewalls depending on desired emission profiles for corresponding LED chips. In certain embodiments, patterns may be provided on one or more mesa sidewalls that do not extend all the way to mesa sidewall corners. In such embodiments, lateral dimensions of pattern features along mesa sidewalls may be precisely provided without requiring the repeating pattern of features to exactly align and repeat around the mesa sidewall corners.

Figure 6:
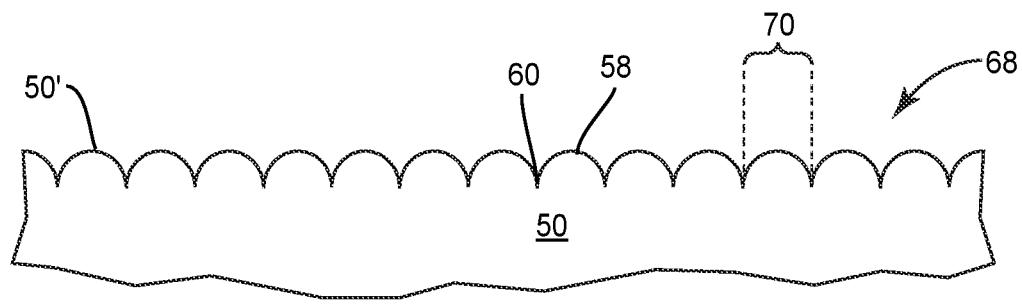
FIG. 6 is a view of a portion of an LED chip that includes a repeating pattern of features and corresponding intersections along the mesa sidewall that are similar to the LED chip of FIG. 4.

FIG. 6 is a view of a portion of an LED chip 68 that includes a repeating pattern of features 58 and corresponding intersections 60 along the mesa sidewall 50' that are similar to the LED chip 64 of FIG. 4. Each intersection 60 may be formed where surfaces of next-adjacent pairs of features 58 are joined along the mesa sidewall 50'. The intersections 60 may provide sharp interfaces that promote more ideal emissions along escape cones in desired emission directions for the LED chip 68 that are away from the mesa sidewalls 50'. Stated differently, the sharp interfaces formed at the intersections 60 may reduce light interacting with the mesa sidewall 50' at normal incidence or other incidence angles that would allow the light to escape the mesa sidewalls 50'. In certain embodiments, widths 70 of each feature 58 may be determined based on increasing the amount of light that may be redirected at the mesa sidewall 50' with consideration to the wavelength of light generated within the mesa 50. In certain embodiments, the widths 70 may be provided in a range from 15 μm to 35 μm, or in a range from 20 μm to 30 μm. In certain embodiments, such dimensions may be sized for use with light having a peak wavelength in a range from 430 nm to 650 nm, or in any number of sub-ranges, such as 430 nm to 480 nm, 500 nm to 570 nm, and/or 600 to 650 nm. In certain embodiments, widths 70 that are smaller than 15 μm may begin to approximate texturing along the mesa sidewalls 50' that could promote light extraction out of the mesa sidewalls 50'. Widths 70 that are too large may reduce a number of the intersections 60 that are provided along each mesa sidewall 50'. In FIG. 6, the features 58 form outwardly curved surfaces of the mesa sidewall 50' with the intersections 60 therebetween. In certain embodiments, the reflective structure 66 as described for FIG. 4 may be provided to cover the features 58. Depending on the overall size of the LED chip 68 relative to the widths 70, the repeating pattern may extend along all mesa sidewalls 50' and corresponding mesa sidewall corners as illustrated for the LED chip 64 of FIG. 4.

Figure 7A:
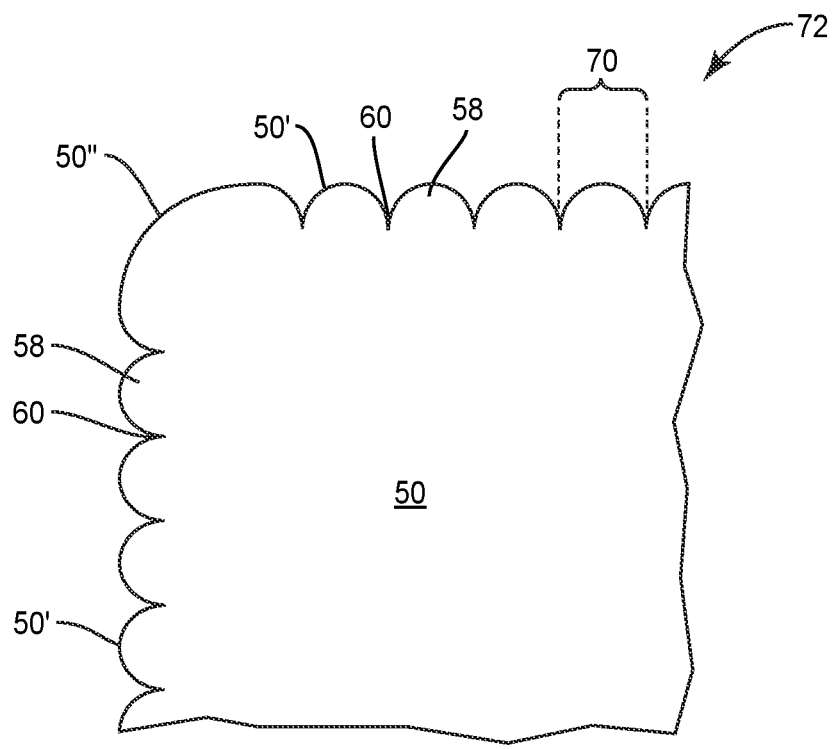
FIG. 7A is a view of a portion of an LED chip that is similar to the LED chip of FIG. 6 for embodiments where the repeating pattern of features does not extend to the mesa sidewall corners.

FIG. 7A is view of a portion of an LED chip 72 that is similar to the LED chip 68 of FIG. 6 for embodiments where the repeating pattern of features 58 does not extend to the mesa sidewall corners 50". In this manner, one or more of the mesa sidewall corners 50" are devoid of the repeating pattern of features 58. In such embodiments, lateral dimensions or widths 70 of the features 58 may be precisely provided independently of how such features 58 may repeat around the mesa sidewall corners 50". In this regard, the widths 70 of each of the features 58 do not necessarily have to scale with smaller and/or larger overall sizes of the LED chip 72, thereby allowing the same repeating pattern to be used, regardless of chip size and without requiring the repeating pattern of features 58 to exactly align and repeat around the mesa sidewall corners 50". This may be advantageous for providing common repeating patterns that are designed for certain peak wavelength ranges, regardless of LED chip size. As with previous embodiments, the reflective structure 66 as described for FIG. 4 may also be provided to cover the features 58 of the LED chip 72 of FIG. 7A.

Figure 7B:
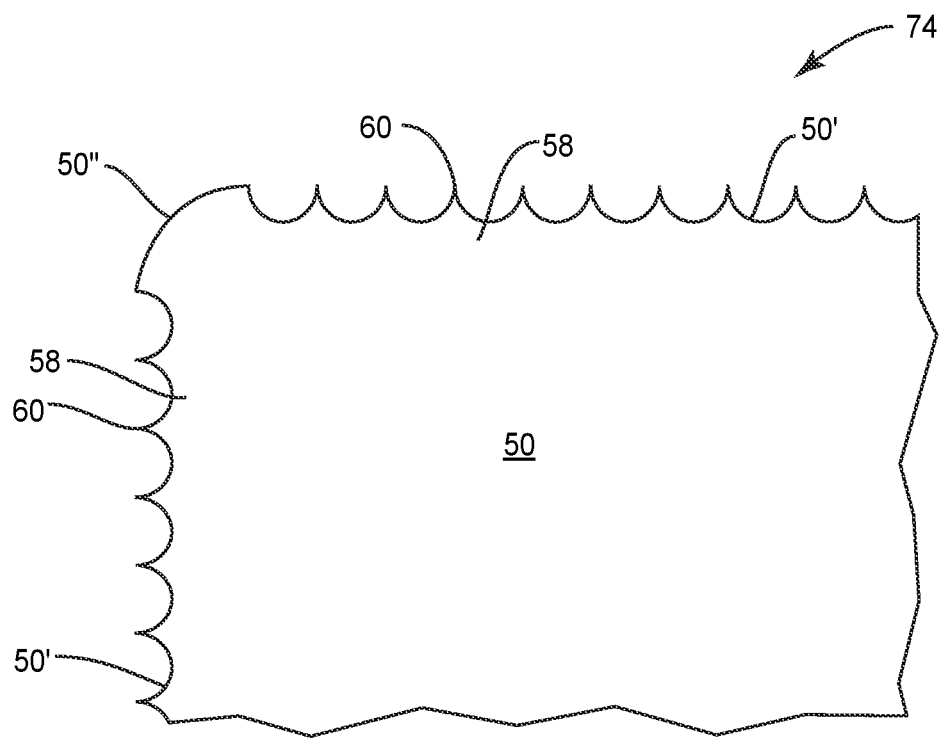
FIG. 7B is a view of a portion of an LED chip that is similar to the LED chip of FIG. 7A, but includes a different repeating pattern of features.

FIG. 7B is a view of a portion of an LED chip 74 that is similar to the LED chip 72 of FIG. 7A, but includes a different repeating pattern of features 58. In FIG. 7B, the repeating pattern of features 58 is inverse to that of FIG. 7A. In this manner, each of the features 58 forms an inwardly curved surface of one or more of the mesa sidewalls 50'. In such an arrangement, the intersections 60 form sharp protrusions of the mesa sidewall 50' for redirecting light. As illustrated in FIG. 7B, the mesa sidewall corners 50" may be devoid of the features 58. In other embodiments, the features 58 may be sized to continuously extend along one or more of the mesa sidewall corners 50" as illustrated in FIG. 4. As with previous embodiments, the reflective structure 66 as described for FIG. 4 may also be provided to cover the features 58 of the LED chip 74 of FIG. 7B.

Figure 8A:
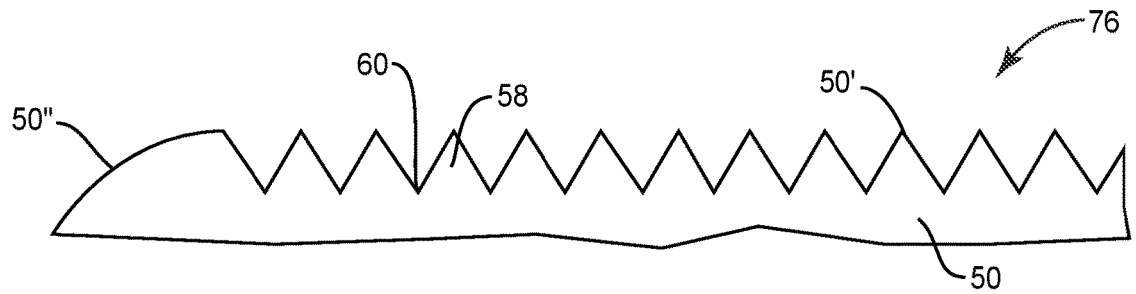
FIG. 8A is a top view of a portion of LED chip that includes a repeating pattern of features that includes triangular shapes in cross-section that may be implemented to redirect light away from mesa sidewalls.
Figure 8B:
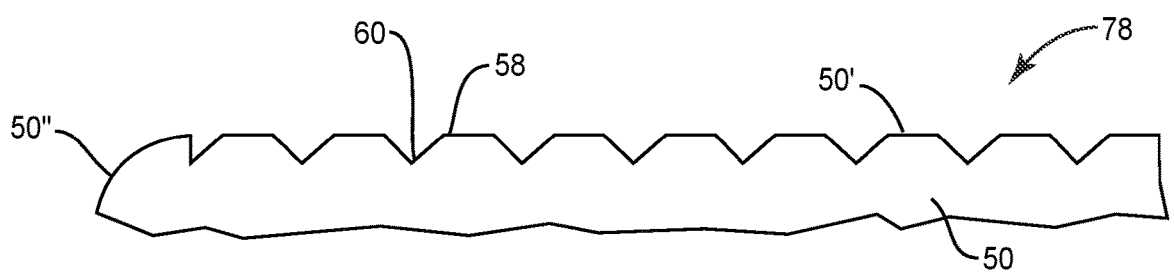
FIG. 8B is a top view of a portion of an LED chip that includes a repeating pattern of features that includes trapezoidal shapes in cross-section that may be implemented to redirect light away from mesa sidewalls.
Figure 8C:
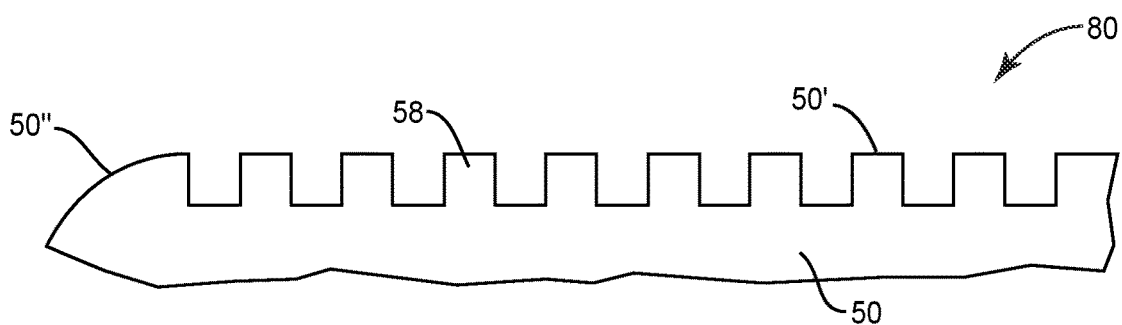
FIG. 8C is a top view of a portion of an LED chip that includes a repeating pattern of features that includes rectangular shapes in cross-section that may be implemented to redirect light away from mesa sidewalls.
Figure 8D:
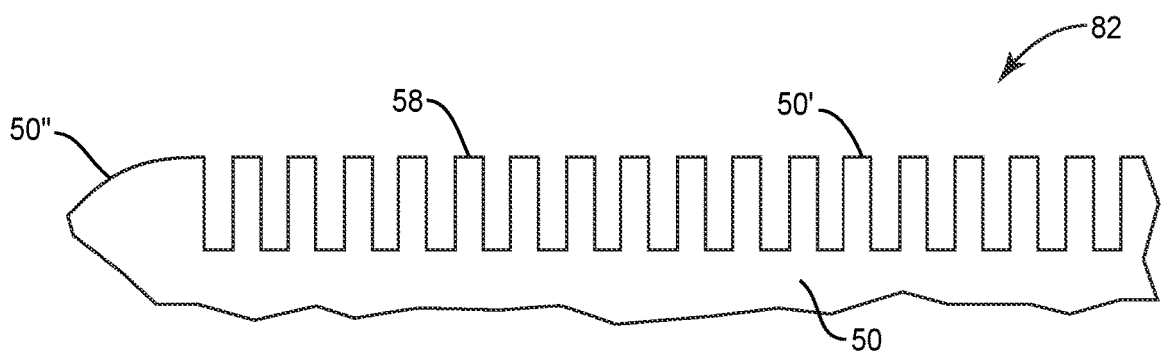
FIG. 8D is a top view of a portion of an LED chip that includes a repeating pattern of features that also includes rectangular shapes in cross-section, but with smaller lateral dimensions that may be implemented to redirect light away from mesa sidewalls.

FIGS. 8A-8D are views of portions of LED chips that are similar to the LED chip 72 of FIG. 7A, but include even more examples of repeating patterns of features 58 that may be implemented to redirect light away from mesa sidewalls. In each of FIGS. 8A-8D, the mesa sidewall corners 50" are illustrated as being devoid of the repeating pattern of features 58 as described above for FIGS. 7A and 7B. In other embodiments, each of the repeating pattern of features 58 in FIGS. 8A-8D may be arranged to also continue along one or more of the mesa sidewall corners 50" as illustrated in FIG. 4. Additionally, widths of features 58 within each of the patterns of FIGS. 8A-8D may be similar to the widths described above for FIGS. 6 and 7A. FIG. 8A is a top view of a portion of an LED chip 76 that includes a repeating pattern of features 58 that includes triangular shapes in cross-section. In this manner, the features 58 may laterally protrude from one or more of the mesa sidewalls 50' and next-adjacent features 58 may abut one another at the intersections 60. FIG. 8B is a top view of a portion of an LED chip 78 that includes a repeating pattern of features 58 that includes trapezoidal shapes in cross-section with corresponding intersections 60. FIG. 8C is a top view of a portion of an LED chip 80 that includes a repeating pattern of features 58 that includes rectangular shapes in cross-section. In such an arrangement, the features 58 may form a sawtooth pattern along the mesa sidewall 50' of the LED chip 80. FIG. 8D is a top view of a portion of an LED chip 82 that includes a repeating pattern of features 58 that also includes rectangular shapes in cross-section, but with smaller lateral dimensions. In this regard, the features 58 may form a sawtooth pattern with a finer pitch than what is illustrated in FIG. 8C.

Figure 9:
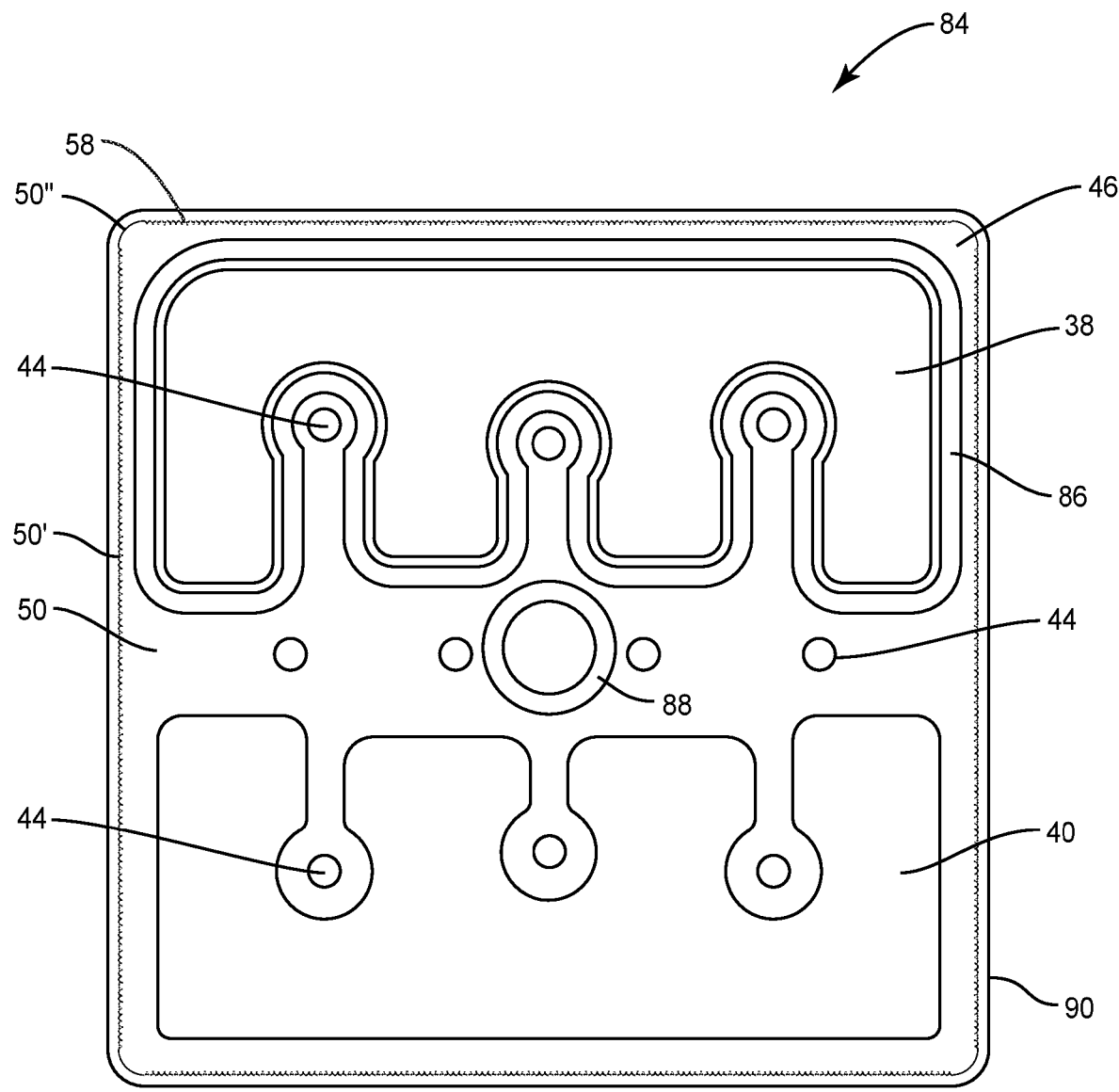
FIG. 9 is a bottom view of another exemplary LED chip that includes a repeating pattern of features along mesa sidewalls according to principles of the present disclosure.

The repeating patterns as described above may be implemented along mesa sidewalls in any number of LED chip geometries. FIG. 9 is a bottom view of another exemplary LED chip 84 that includes a repeating pattern of features 58 along mesa sidewalls 50' according to principles of the present disclosure. The LED chip 84 is similar to the LED chip 64 of FIG. 4, but includes a different layout for the n-contact 40 and the p-contact 38 on the mounting face 46. As illustrated, each of the n-contact 40 and the p-contact 38 is formed with shapes that conform around a number of the n-contact interconnects 44. A first isolation region 86 is provided around a perimeter of the p-contact 38 for electrical isolation with the n-contact 40. A second isolation region 88 is provided in a circular shape in the middle of the LED chip 84 to isolate a central portion of the mesa 50. The region of the mesa 50 that is bounded by the second isolation region 88 may be used as a mechanical contact point during fabrication and/or handling of the LED chip 84, such as a push pin and/or ejector contact point. As illustrated in FIG. 9, the mesa sidewalls 50' may be formed with a repeating pattern of features 58 and the mesa sidewall corners 50" may be devoid of the features 58. As previously described, this allows widths of the features to be selected based on interactions with light generated in the mesa 50 without consideration to overall dimensions of the LED chip 84. In other embodiments, desired feature widths for light redirection away from the mesa sidewalls 50' may be provided in a range that allows the repeating pattern to continue around each of the mesa sidewall corners 50". In further embodiments, street 90 of the LED chip 84 that are outside of the mesa 50 may be electrically connected to the n-contact 40. As previously described, the streets 90 may include portions of the n-type layer (16 of FIG. 2) that are outside the mesa 50. This may be accomplished by providing one or more internal metal layers of the LED chip 84 that are electrically coupled to the n-contact 40 and extending such metal layers to the streets 90. Such a configuration may provide increased current spreading for the LED chip 84 as well as increased light reflecting along a perimeter of the mesa 50 for any light that may inadvertently escape the mesa sidewalls 50'.

It is contemplated that any of the foregoing aspects, and/or various separate aspects and features as described herein, may be combined for additional advantage. Any of the various embodiments as disclosed herein may be combined with one or more other disclosed embodiments unless indicated to the contrary herein.

Those skilled in the art will recognize improvements and modifications to the preferred embodiments of the present disclosure. All such improvements and modifications are considered within the scope of the concepts disclosed herein and the claims that follow.

What is claimed is:

1. A light emitting diode (LED) chip, comprising:
an n-type layer;
a p-type layer;
an active layer arranged between the n-type layer and the p-type layer, wherein the p-type layer, the active layer, and a portion of the n-type layer form an active LED structure mesa with at least one mesa sidewall, wherein the at least one mesa sidewall forms a shape with a repeating pattern along only a first portion of the at least one mesa sidewall such that a second portion of the at least one mesa sidewall is devoid of any repeating pattern; and
a reflective structure on the active LED structure mesa and on the at least one mesa sidewall, wherein the reflective structure is arranged to cover the repeating pattern.

2. The LED chip of claim 1, wherein the reflective structure comprises a first reflective layer on the active LED structure mesa and on the at least one mesa sidewall.

3. The LED chip of claim 2, wherein the reflective structure comprises a second reflective layer on the active LED structure mesa and on the at least one mesa sidewall, wherein the first reflective layer is arranged between the second reflective layer and the active LED structure mesa.

4. The LED chip of claim 3, wherein the first reflective layer comprises a dielectric layer and the second reflective layer comprises a metal layer.

5. The LED chip of claim 1, further comprising a p-contact electrically connected to the p-type layer and an n-contact electrically connected to the n-type layer, wherein a portion of the n-contact extends past the active LED structure mesa to electrically connect with portions of the n-type layer that are outside the active LED structure mesa.

6. The LED chip of claim 5, wherein the at least one mesa sidewall is one of a plurality of mesa sidewalls of the active LED structure mesa, and the n-contact electrically connects with portions of the n-type layer outside of three mesa sidewalls of the plurality of mesa sidewalls.

7. The LED chip of claim 1, wherein the repeating pattern is formed by a plurality of features in the at least one mesa sidewall and each feature of the plurality of features abuts at least one neighboring feature of the plurality of features at an intersection.

8. The LED chip of claim 7, wherein each feature of the plurality of features forms an outwardly curved surface of the at least one mesa sidewall.

9. The LED chip of claim 7, wherein each feature of the plurality of features forms an inwardly curved surface of the at least one mesa sidewall.

10. The LED chip of claim 7, wherein each feature of the plurality of features forms a triangular cross-sectional shape along the at least one mesa sidewall.

11. The LED chip of claim 7, wherein each feature of the plurality of features forms a trapezoidal cross-sectional shape along the at least one mesa sidewall.

12. The LED chip of claim 7, wherein each feature of the plurality of features forms a rectangular cross-sectional shape along the at least one mesa sidewall.

13. A light emitting diode (LED) chip, comprising:
an n-type layer;
a p-type layer; and
an active layer arranged between the n-type layer and the p-type layer, wherein the p-type layer, the active layer, and a portion of the n-type layer form an active LED structure mesa with at least one mesa sidewall;
wherein the at least one mesa sidewall forms a repeating pattern along the at least one mesa sidewall, the repeating pattern being formed by a plurality of features, wherein each feature of the plurality of features is an outwardly curved surface of the at least one mesa sidewall and each feature abuts at least one next-adjacent feature of the plurality of features at an intersection with the outwardly curved surface of the at least one next-adjacent feature.

14. The LED chip of claim 13, wherein a width of each feature of the plurality of features is in a range from 15 microns (μm) to 35 μm.

15. The LED chip of claim 14, wherein the width of each feature of the plurality of features is in a range from 20 μm to 35 μm.

16. The LED chip of claim 13, wherein the repeating pattern extends along at least one mesa sidewall corner of the active LED structure mesa.

17. The LED chip of claim 13, wherein at least one mesa sidewall corner of the active LED structure mesa is devoid of the repeating pattern.

18. A light emitting diode (LED) chip, comprising:
an n-type layer;
a p-type layer; and
an active layer arranged between the n-type layer and the p-type layer;
wherein the p-type layer, the active layer, and a portion of the n-type layer form an active LED structure mesa with mesa sidewalls and mesa sidewall corners, wherein the mesa sidewalls form a repeating pattern of outwardly curved features having a same width along a first portion of the each mesa sidewall and the repeating pattern does not extend to a second portion of each mesa sidewall proximate the mesa sidewall corners.

19. The LED chip of claim 18, wherein the repeating pattern is formed by a plurality of features in the mesa sidewalls and each feature of the plurality of features abuts at least one next-adjacent feature of the plurality of features at an intersection.

20. The LED chip of claim 19, where the intersection is formed by intersecting surfaces of next-adjacent features of the plurality of features.

21. The LED chip of claim 19, wherein a width of each feature of the plurality of features is in a range from 15 microns (μm) to 35 μm.

22. The LED chip of claim 18, further comprising a reflective structure on the active LED structure mesa and on the mesa sidewalls, wherein the reflective structure is arranged to cover the repeating pattern.

* * * * *